(12) United States Patent
Binder et al.

(10) Patent No.: US 7,911,026 B2
(45) Date of Patent: Mar. 22, 2011

(54) CHIP CARRIER WITH REDUCED INTERFERENCE SIGNAL SENSITIVITY

(75) Inventors: Florian Binder, Gauting-Buchendorf (DE); Thomas Haneder, Dachau (DE); Judith Lehmann, Munich (DE); Manfred Schneegans, Vaterstetten (DE); Grit Sommer, Grafing Bei Munich (DE)

(73) Assignee: Qimonda AG, Munich (DE)

( * ) Notice: Subject to any disclaimer, the term of this patent is extended or adjusted under 35 U.S.C. 154(b) by 731 days.

(21) Appl. No.: 11/618,172

(22) Filed: Dec. 29, 2006

(65) Prior Publication Data
US 2007/0210417 A1    Sep. 13, 2007

(30) Foreign Application Priority Data
Dec. 29, 2005    (DE) ................. 10 2005 062 932

(51) Int. Cl.
H01L 21/02    (2006.01)
(52) U.S. Cl. ........ 257/532; 257/211; 257/266; 257/635; 257/637; 361/760; 361/761; 361/763; 361/777
(58) Field of Classification Search ............. 257/532, 257/E21.627, E21.008, 637, 635, 266, 211; 438/618, 381, 396; 361/760, 761, 762, 763, 361/777, 780
See application file for complete search history.

(56) References Cited

U.S. PATENT DOCUMENTS

| 6,518,670 | B1 | 2/2003 | Mandelman et al. |
| 6,970,362 | B1 | 11/2005 | Chakravorty |
| 7,557,014 | B2 * | 7/2009 | Okamoto et al. ............. 438/396 |
| 2005/0023664 | A1 | 2/2005 | Chudzik et al. |
| 2005/0263874 | A1 | 12/2005 | Shimizu et al. |

FOREIGN PATENT DOCUMENTS
WO    WO 2005/104149 A1    11/2005
* cited by examiner

Primary Examiner — Thao X Le
Assistant Examiner — Thanh Y Tran
(74) Attorney, Agent, or Firm — Dickstein Shapiro LLP

(57) ABSTRACT

Carrier including:
a substrate having a first interface with first contact holes, and a second interface, which lies opposite the first interface, with second contact holes. The substrate includes a substrate body and electrically conductive contact channels formed therein, wherein each of the contact channels electrically conductively connects a first contact hole to a second contact hole. The carrier also includes a front-side wiring layer arranged on the first interface and; has a first front-side metallization layer formed therein such that it includes a first capacitor electrode for electrically connecting microelectronic devices and/or circuits to a first pole of a signal or supply voltage. The first capacitor electrode, at least partly via a capacitor dielectric formed in the carrier, couples capacitively to electrically conductive regions of a second front-side metallization layer and/or the substrate which at least partly form a second capacitor electrode for electrically connecting the microelectronic devices and/or circuits to a second pole of the signal or supply voltage.

20 Claims, 4 Drawing Sheets

CHIP CARRIER WITH REDUCED INTERFERENCE SIGNAL SENSITIVITY

CROSS-REFERENCE TO RELATED APPLICATION

This application claims priority to German Patent Application Serial No. 10 2005 062 932.6, which was filed Dec. 29, 2005, and is incorporated herein by reference in its entirety.

BACKGROUND OF THE INVENTION

The present invention relates to a carrier for microelectronic components and/or circuits, in particular chips, with low sensitivity to interference disturbances of supply or signal voltages. In this case, the present invention describes an innovative technology platform for the production of large scale integrated "system in package" modules based on silicon carriers and finds application in the field of communications technology and also automotive and industrial electronics (e.g. radiofrequency modules for mobile telephones, base stations or else radar modules for automobiles) or other fields in which very large scale integration is desirable for space or cost reasons. "System in package" modules are currently produced using various carrier materials such as, for example, LTCC ceramic, laminate PCB, glass or silicon.

As integration density increases, as signal frequencies increase and as supply voltages and signal levels decrease, the sensitivity of integrated circuits with regard to interference signals increases. In particular fluctuations and interference disturbances of the supply voltage or high-frequency interference disturbances of the signals to be processed, in particular radiofrequency signals and fast digital signals, can adversely influence the function and reliability of the system. Consequently, it is always necessary to filter in particular high-frequency interference signals out of the signal and/or supply voltages that are to be transmitted to a chip carrier of, in particular, a "system in package" module.

This "interference suppression" of the supply voltage and also the filtering for signal voltages are affected by means of discrete components, in particular SMD components, which are arranged on the carrier. This usually involves passive components with the aid of which high-frequency portions are filtered out of the supply voltage or which are used as filters or tuning elements for signal voltages.

However, the miniaturization to said passive components has not been able hitherto to keep up with development in the miniaturization of integrated circuits. Therefore, such interference-suppression and filter components always constitute a limit for the miniaturization of "system in package" modules.

SUMMARY OF THE INVENTION

A carrier for microelectronic devices and/or circuits including a substrate having a first interface with a plurality of first contact holes, a second interface, which essentially lies opposite the first interface, with a plurality of second contact holes, a substrate body, and a plurality of electrically conductive contact channels formed in the substrate body, wherein each of the contact channels electrically conductively connects a first contact hole to a second contact hole; and at least one front-side wiring layer arranged on the first interface and having formed therein at least one first front-side metallization layer at least partly comprising a first capacitor electrode for electrically connecting the microelectronic devices and/or circuits to a first pole of a signal or supply voltage, wherein the first capacitor electrode, at least partly via a capacitor dielectric formed in the carrier, couples capacitively to electrically conductive regions of a second front-side metallization layer and/or of the substrate which at least partly form a second capacitor electrode for electrically connecting the microelectronic devices and/or circuits to a second pole of the signal or supply voltage.

BRIEF DESCRIPTION OF THE DRAWINGS

The invention is described by way of example below with reference to accompanying drawings of preferred embodiments, in which.

DETAILED DESCRIPTION OF THE INVENTION

Figure 1:
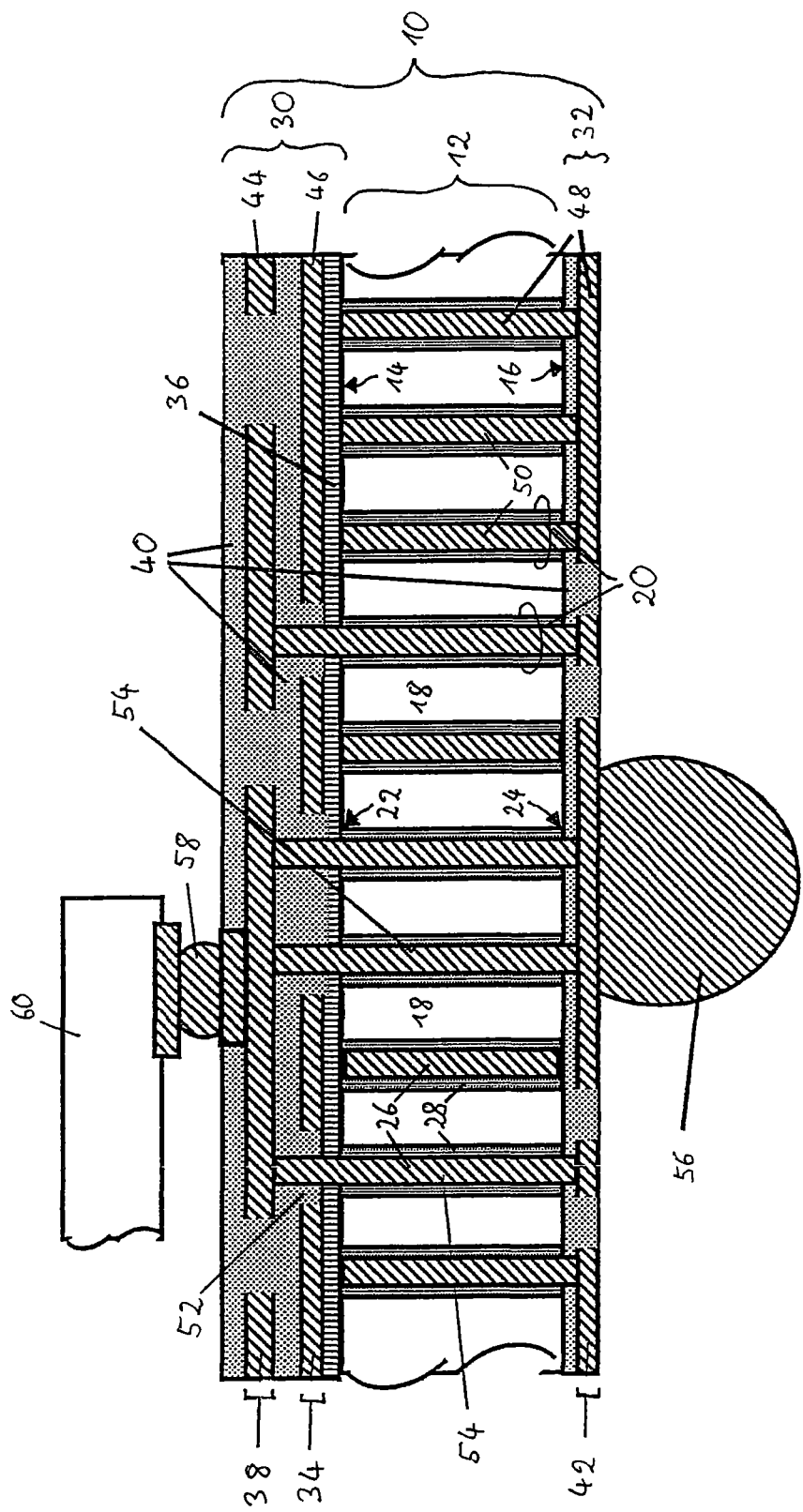
FIG. 1 shows a first preferred embodiment of the present invention.

The present invention provides a carrier for integrated circuits, in particular chips for "system in package" modules, which enables a compact design in conjunction with low interference signal sensitivity.

Consequently, the invention provides a carrier for microelectronic devices and/or circuits, in particular chips, which comprises: a substrate having a first interface with a plurality of first contact holes, a second interface, which essentially lies opposite the first interface, with a plurality of second contact holes, a substrate body, and a plurality of electrically conductive contact channels formed in the substrate body, wherein each of the contact channels electrically conductively connects a first contact hole to a second contact hole; and at least one front-side wiring layer arranged on the first interface and having formed therein at least one first front-side metallization layer at least partly comprising a first capacitor electrode for electrically connecting the microelectronic devices and/or circuits to a first pole of a signal or supply voltage, wherein the first capacitor electrode, at least partly via a capacitor dielectric formed in the carrier, couples capacitively to electrically conductive regions of a second front-side metallization layer and/or of the substrate which at least partly form a second capacitor electrode for electrically connecting the microelectronic devices and/or circuits to a second pole of the signal or supply voltage.

Consequently, at least one part of the first front-side metallization layer forms at least one part of the first capacitor electrode. The second capacitor electrode is at least partly formed either in a further front-side metallization layer or is formed by conductive regions of the substrate. The second capacitor electrode could also comprise both regions of the second front-side metallization layer and conductive regions of the substrate. What is crucial is that the two capacitor electrodes are insulated from one another by the capacitor dielectric and form a capacitor structure. The precise geometry of the capacitor structure depends, in particular, on which conductive regions of the carrier and, in particular, of the substrate are formed as second capacitor electrode.

In particular, those regions of the substrate are at least partly formed to give the second capacitor electrode which can be formed or produced with a sufficient electrical conductivity in conventional carriers with comparable substrates without additional technological outlay. They are preferably the substrate body and/or the contact channels. As a result, the carrier according to the invention can be produced in a particularly simple and cost-effective manner.

In this case, the use of designations "front-side" and "rear-side" is not restrictive, but rather serves merely for differentiating the first from the second interface or the layers arranged thereon. For the definition of the invention, the two terms could therefore also be used in interchanged fashion.

The carrier according to the invention constitutes a universally useable chip carrier for the mounting of a plurality of microelectronic devices (that is to say dies, preferably made of silicon) and, in particular, a carrier for use in "system in package" modules which electrically conductively connects said devices to one another very well.

For this purpose, in the carrier, as in conventional carriers, use is made of wiring layers with metallization layers and passage channels with conductive contact channels in order to enable a rewiring or an electrical contact-connection of electronic devices and in particular chips. The rewiring or contact-connection is made possible in particular via the at least one first or second front-side interconnect layer or metallization layer. For this purpose, the metallization layer is preferably structured essentially laterally, that is to say perpendicular to the direction of the substrate normal, into a plurality of interconnects. The contact-connection or rewiring usually does not involve using the entire area of the metallization layer for interconnects and/or plated-through holes. In particular, the length of signal lines is kept as short as possible in order to avoid electrical resistances and parasitic inductances and the area used for the signal lines is kept as small as possible in order to suppress parasitic capacitances. During the production of metallization layers, however, preferably whole-area metal layers are applied which are subsequently structured in the form of interconnects.

The present invention now preferably utilizes areal metallization layers that are present at least partly for the formation of at least the first areal capacitor electrode. The effect of parasitic capacitances that is usually to be avoided in signal lines is exploited in a targeted manner in the present invention by means of the capacitive coupling via the capacitor dielectric. The capacitance that arises attenuates or suppresses or filters in particular undesirable high-frequency fluctuations or interference disturbances of the supply voltage transmitted to the electronic devices and in particular chips by means of the capacitor electrodes or of the signals to be processed.

A module based on a carrier according to the present invention thus has a significantly reduced interference signal sensitivity. Particularly preferably, the area over which the two capacitor electrodes couple capacitively and in particular the area occupied by the first capacitor electrode in the first front-side metallization layer, and hence the electrical capacitance, are adapted to the requirements of the electronic components or chips that are integrated or to be integrated in the module, and/or to the supply system used or the signal voltages, in such a way that it is possible at least partly to dispense with external, passive components for interference suppression. Since, in the production of a carrier according to the invention no complicated additional technological steps are required, but on the other hand the requirements made in respect of external interference-suppressing components are reduced, the production costs in particular of "system in package" modules can be reduced by the present invention. Moreover, the reduction of discrete external and in particular passive components reduces the size of such modules, which is particularly advantageous for applications in which a high packing density is required.

A further advantage afforded by a carrier according to the present invention is that reduction of required external components (such as e.g. filter components) makes it possible to reduce the length of the requisite supply leads and hence parasitic inductances and resistances. As a result, the interference suppression and filtering effects are additionally improved and, in particular, become better controllable or adjustable.

Preferably, the carrier furthermore comprises a second or rear-side wiring layer arranged at the second interface, in which wiring layer at least one first rear-side metallization layer is formed. Preferably, in the first front-side metallization layer and/or the first rear-side metallization layer there is formed at least one first front-side and/or rear-side interconnect, respectively, which is electrically conductively connected to at least one contact channel. Particularly preferably, therefore, at least one first front-side interconnect is electrically conductively connected to at least one rear-side interconnect via at least one contact channel.

In one preferred embodiment, the carrier furthermore comprises at least one second front-side and/or rear-side metallization layer which is formed in the front-side and/or rear-side wiring layer, respectively, and which is spaced apart further from the front-side and/or rear-side interface, respectively, than the first front-side and/or rear-side metallization layer, respectively, and in which is formed at least one second front-side and/or rear-side interconnect, respectively, which is electrically conductively connected to at least one contact channel with the formation of a plated-through hole. In this case, cutouts are preferably provided in the first front-side and/or rear-side metallization layer, respectively, in particular in the region of the plated-through hole, which cutouts electrically insulate the first front-side and/or rear-side metallization layer, respectively, from the plated-through hole.

Accordingly, one or a plurality of further metallization layers could be formed in the front-side or rear-side wiring layer. Preferably, said metallization layers are at least partly electrically conductively connected to further contact channels and/or other metallization layers with the formation of further plated-through holes. In this case, intervening metallization layers in particular in the region of the plated-through holes preferably have cutouts which electrically insulate said intervening metallization layers from the plated-through holes. As an alternative or in addition, different metallization layers, in particular within the same wiring layer and/or in different wiring layers, could also be electrically conductively connected to one another. In this case, preferably at least two different interconnects in the different metallization layers are electrically conductively connected to one another.

Preferably, at least one rear-side interconnect is electrically conductively connected to at least one rear-side contact and at least one front-side interconnect is electrically conductively connected to at least one front-side contact. Via these contacts it is possible to produce a good electrical conductivity to the microelectronic devices and/or circuits.

Preferably, the substrate comprises macroporous silicon. Particularly preferably, the substrate body is at least partly electrically conductively doped (p- or n-doped). An electrically conductive doping of the substrate body and in particular doped silicon is particularly suitable in the production of the substrate and in particular in a preferred electrochemical production method for macroporous silicon. Consequently, no additional complicated technological steps are necessary for this embodiment.

The first capacitor electrode preferably comprises a largest possible area of the first front-side metallization layer in order to bring about a largest possible electrical capacitance with respect to the second capacitor electrode. Accordingly, the second capacitor electrode also preferably comprises a largest possible area of the second front-side metallization and/or of the substrate. In particular, the total area of the projection of the first and/or second capacitor electrode in the direction of the substrate normal (that is to say in a direction essentially perpendicular to the first interface) onto the first interface is preferably greater than 1 mm$^2$, even more preferably greater than 5 mm$^2$, most preferably greater than 20 mm$^2$. The entire carrier preferably comprises an area of at least 10 mm$^2$, even more preferably at least 30 mm$^2$. Particularly preferably, the first capacitor electrode essentially comprises the entire area not required or used for signal lines, that is to say in particular interconnects, and/or plated-through holes in the first front-side metallization layer.

Preferably, the thickness of the capacitor dielectric is at least partly smaller than 500 nm, particularly preferably smaller than 250 nm. Consequently, in particular the first and the second capacitor electrode are preferably at least partly at a mutual distance that is less than 500 nm, even more preferably less than 250 nm. Moreover, the capacitor dielectric preferably comprises an insulator having a high dielectric constant, in particular $TiO_2$ and/or $Al_2O_3$ and/or $Ta_2O_5$ and/or $HfO_2$ and/or $Si_3N_4$ and/or ONO (in particular the layer structure $SiO_2/Si_3N_4/SiO_2$). Both contribute to achieving a high electrical capacitance between the capacitor electrodes and hence particularly good attenuation properties.

In a carrier according to the invention, the electrical capacitance formed per area, that is to say in particular per area perpendicular to the direction of the substrate normal, or parallel to the first and/or second interface, between the first capacitor electrode and the second capacitor electrode is preferably at least partly greater than 500 pF/mm$^2$, even more preferably greater than 1 nF/mm$^2$, most preferably greater than 3 nF/mm$^2$. In particular, the total electrical capacitance formed in the carrier between the first capacitor electrode and the second capacitor electrode is preferably greater than 50 nF, even more preferably greater than 100 nF, most preferably greater than 300 nF.

Preferably, the contact channels are at least partly spaced apart from and electrically insulated from the substrate body by passage insulations. In this case, the passage insulations are preferably configured in tubular fashion and surround the electrically conductive contact channels toward the substrate body.

Preferably, the first capacitor electrode comprises a plurality of first capacitor fingers formed by a plurality of the contact channels which are electrically conductively connected to the first front-side metallization layer. As a result, the first capacitor electrode has a particularly large surface area and in particular a large contact area or coupling area with respect to the substrate and in particular the electrically conductive regions formed in the substrate. Moreover, the potential of the first capacitor electrode is thereby transmitted as far as the second interface, which preferably brings about a capacitive coupling to a rear-side metallization layer in a rear-side wiring layer. This is advantageous particularly when the second capacitor electrode at least partly comprises the first rear-side metallization layer. In this case, not necessarily all of the contact channels that are electrically conductively connected to the first front-side metallization layer form capacitor fingers. Thus, in particular at least one interconnect which is electrically insulated from the first capacitor electrode might be formed in the first front-side metallization layer. A contact channel that is electrically conductively connected to said interconnect then forms a plated-through hole to the second interface.

Preferably, the first rear-side metallization layer at least partly comprises the second capacitor electrode. Particularly preferably, in this case the second capacitor electrode comprises a plurality of second capacitor fingers formed by a plurality of the contact channels which are electrically conductively connected to the first rear-side metallization layer. In this case, it is particularly advantageous if the capacitor dielectric comprises the passage insulations of the first and/or second capacitor fingers. Consequently, preferably the first and/or second capacitor fingers are spaced apart from and electrically insulated from the substrate body by the capacitor dielectric.

It is particularly preferred, moreover, if the first capacitor electrode and/or the second capacitor electrode comprises a closed area in the first front-side and/or rear-side metallization layer, respectively, in such a way that the projection of said closed area onto the first and/or second interface, respectively, covers a plurality of first and/or second contact holes, respectively. It is thus possible to achieve a particularly good capacitive coupling of the second and/or first capacitor fingers formed in the corresponding contact channels to the first and/or second capacitor electrode, respectively.

Preferably, the first front-side metallization layer and/or the first rear-side metallization layer, and in particular the first capacitor electrode and/or the second capacitor electrode, is at least partly spaced apart from the first and/or second interface, respectively, and in particular electrically insulated from the substrate body and/or from contact channels, by the capacitor dielectric. As a result, preferably in particular the second and/or first capacitor fingers are electrically insulated from the first front-side and/or rear-side metallization layer, respectively.

Particularly preferably, the capacitive coupling between the first and the second capacitor electrode is effected via the substrate body. This is advantageous in particular if the first and the second capacitor electrode in each case comprises a plurality of contact channels as capacitor fingers. This arrangement brings about, in particular, a series circuit of two capacitances. In this case, the first capacitance is formed between the first capacitor fingers and the substrate body and the second capacitance is formed between the substrate body and the second capacitor fingers. In this case, the first and second capacitor fingers are preferably at least partly arranged alternately at least in one direction. The first and second capacitor electrodes thus preferably form an interdigital structure via the first and second capacitor fingers.

In a further preferred embodiment, the second capacitor electrode at least partly comprises the substrate body. Consequently, the capacitive coupling preferably arises essentially between the first capacitor electrode and the substrate body.

In a particularly preferred further embodiment, the second capacitor electrode is at least partly formed in a second front-side metallization layer which is at least partly spaced apart from the first front-side metallization layer by the capacitor dielectric. Preferably, the second front-side metallization layer is in this case at least partly arranged essentially parallel to the first metallization layer.

In particular, the second capacitor electrode is preferably isolated from the first capacitor electrode by the capacitor dielectric essentially in terms of its entire area, apart from regions of contact-connections or plated-through holes, in the direction of the substrate normal. A structure similar to a plate capacitor thus forms. In this case, a further front-side metallization layer which in particular is electrically insulated from the capacitor electrodes may be formed between the first front-side metallization layer and the first interface.

Different preferred embodiments of a carrier according to the invention are specified in FIGS. 1 to 4. In the electrical design of the system, preferred planes for the rewiring of the signals (e.g. radio frequency signals or digital high-speed signals), ground and the supply voltage are defined in the layer construction of the silicon carrier. Between the layers of ground and the supply voltage, a coupling capacitance is realized via the dielectric used. Through the use of a high-permittivity material such as e.g. $TiO_2$ and/or $Al_2O_3$ and/or $Ta_2O_5$ and/or $HfO_2$ and/or $Si_3N_4$ and/or ONO (in particular the layer structure $SiO_2/Si_3N_4/SiO_2$), it is possible to achieve high capacitance values for interference suppression of the supply system or for filtering of interference disturbances in signals.

In particular, FIG. 1 shows a first preferred embodiment of the present invention. The carrier 10 illustrated therein comprises a substrate 12 comprising a first essentially planar surface or interface 14 and an essentially planar second surface or interface 16, which is preferably parallel thereto and lies opposite the first interface 14. The substrate 12 comprises a substrate body 18, which preferably comprises silicon.

A plurality of passage channels 20 are formed in the substrate body 18, each passage channel 20 of which in each case opens via a first contact hole 22 in the first interface 14 and a second contact hole 24 in the second interface 16. Each of the passage channels 20 has an electrically conductive contact channel 26 that produces an electrically conductive connection between the first contact hole 22 and the second contact hole 24. The contact channel 26 is electrically insulated from the substrate body 18 by means of a passage insulation 28. In this case, the passage insulation 28 comprises electrically insulating material such as, for example, $SiO_2$ or $TiO_2$. Preferably, the passage insulations 28 are formed essentially in tubular fashion and in each case form the wall of the passage channels 20. Most preferably, the passage channels 20 run essentially parallel to one another and parallel to a direction of the substrate normal, that is to say a direction perpendicular to the first or second interface. The passage channels thus preferably run rectilinearly along a longitudinal axis parallel to the direction of the substrate normal and further preferably have in each case an essentially circular cross section perpendicular to the direction of the substrate normal, that is to say parallel to the first 14 or second interface 16.

In particular, the passage channels 20 are preferably arranged essentially regularly and in particular at least partly equidistantly relative to one another. In a cross section parallel to the first 14 or second interface 16, the passage channels 20 are thus at least partly arranged in a regular two-dimensional grid. In the preferred embodiments shown, the passage channels 20 are arranged in particular in a square grid, the distance between the midpoints of adjacent passage channels preferably being between 2 µm and 200 µm, even more preferably between 10 µm and 100 µm. The diameter of the passage channels 20 preferably corresponds to half of the distance between adjacent passage channels 20 and is thus preferably between 1 µm and 100 µm, even more preferably between 5 µm and 50 µm. Consequently, the substrate 12 most preferably has between 100 and 10 000 passage channels 20 per $mm^2$.

Said passage channels are preferably produced by electrochemical etching. Particularly preferably, in this case blind holes are produced by electrochemical etching in a silicon substrate from a first, front-side surface of the silicon substrate. Afterward, an insulator layer is preferably produced on the surfaces of the substrate obtained in the preceding step. By selective isotropic etching from the second, rear-side surface, the blind hole ends produced are preferably uncovered in such a way that the respective blind hole walls which are formed by the insulator layer project from the substrate on the rear-side surface and, in this region, are defined only by the insulator layer forming the respective blind hole wall, and this in turn can be set by way of the length of the projecting insulator layer. Afterward, a further insulator layer is preferably produced on the surfaces of the substrate obtained. Subsequently, a plurality of the blind holes produced are preferably filled with metal. This is preferably done by introducing the substrate into a melt of the metal under pressure in a process chamber containing the melt. Preferably, the melt is subsequently cooled asymmetrically in the blind holes from the front-side surface, with the result that the metal contracts during cooling in the blind holes toward the rear-side surface until the solidified metal surface lies on a plane with the rear-side surface of the substrate. Finally, the remaining unfilled blind hole ends which project from the substrate and are formed only by the insulator layer in this region are preferably removed. As an alternative, the passage channels could also be produced by known plasma etching methods.

The carrier 10 furthermore has a first wiring layer 30 arranged at the first interface 14, also referred to as front-side wiring layer 30, and a second wiring layer 32 arranged at the second interface 16, also referred to as rear-side wiring layer 32. In the embodiment shown in FIG. 1, the front-side wiring layer 30 comprises a first front-side metallization layer 34, which is spaced apart from the first interface 14 by a capacitor dielectric 36. The capacitor dielectric 36 is arranged at the first interface 14 and forms an electrically insulating layer that preferably has a high relative permittivity. Particularly preferably, the capacitor dielectric 36 comprises $TiO_2$ and/or $Al_2O_3$ and/or $Ta_2O_5$ and/or $HfO_2$ and/or $Si_3N_4$ and/or ONO (in particular the layer structure $SiO_2/Si_3N_4/SiO_2$) having a relative permittivity of up to 95 and a typical thickness in the direction of the substrate normal of preferably approximately 200 nm. Smaller thicknesses (e.g. approximately 100 nm) are also possible. The first front-side metallization layer 34 preferably directly adjoins the capacitor dielectric 36.

Moreover, the first wiring layer 30 in the embodiment shown in FIG. 1 has a second front-side metallization layer 38, which is spaced apart further from the first interface 14 in the direction of the substrate normal than the first front-side metallization layer 34 and which is at least partly electrically insulated from the first front-side metallization layer 34 by a front-side wiring insulation 40. In a departure from the embodiment shown, one or a plurality of further front-side metallization layers could be provided in the first or front-side wiring layer.

The second or rear-side wiring layer 32 has a first rear-side metallization layer 42. The latter may, as shown in FIG. 1, be spaced apart from the second interface 16 by a rear-side wiring insulation 40. As an alternative, in a departure from the embodiment illustrated, the first rear-side metallization layer 42 could also be arranged directly at the second interface 16. The second or rear-side wiring layer 32 could also have one or a plurality of further metallization layers.

The metallization layers both in the front-side wiring layer 30 and in the rear-side wiring layer 32 preferably run essentially along planes perpendicular to the direction of the substrate normal. Depending on the configuration of the carrier 10, however, the metallization layers may also have steps in the direction of the substrate normal. In this case, each of the metallization layers preferably corresponds to a metallic layer or interconnect layers produced in a single metallization process. If the surface of the carrier has a step prior to the deposition of the respective metallization layer, then said step is also present in the corresponding metallization layer.

The metallization layers are at least partly structured in a lateral direction, that is to say perpendicular to the direction of the substrate normal. The metallization within the respective metallization layer is therefore partly interrupted in the lateral direction. This is desirable in particular where individual regions of the respective metallization layer are intended to be electrically insulated from one another. Interconnects 44 are preferably at least partly formed in a conventional manner in the metallization layers.

What is essential to the preferred embodiment shown is that at least one metallization layer at least partly comprises a first capacitor electrode 46 and another metallization layer at least partly comprises a second capacitor electrode 48. In the first embodiment shown, the first capacitor electrode 46 is formed at least as part of the first front-side metallization layer 34, while the second capacitor electrode 48 is at least partly comprised by the first rear-side metallization layer 42. In this embodiment, the second capacitor electrode 48 additionally comprises a plurality of capacitor fingers 50. The plurality of capacitor fingers 50 of the second capacitor electrode 48 are formed by a portion of the plated-through holes or contact channels 26 and are electrically conductively connected to that part of the second capacitor electrode 48 which is formed in the first rear-side metallization layer 42. The capacitor fingers 50 of the second capacitor electrode 48 adjoin the capacitor dielectric 36 via the first interface 14.

In this case, the first capacitor electrode 46 is formed in areal fashion or in large-area fashion, that is to say that the first capacitor electrode 46 comprises a closed electrically conductive layer which, in both dimensions perpendicular to the direction of the substrate normal, that is to say at least partly essentially parallel to the first interface 14, has an extent which corresponds to a multiple of the distances between adjacent contact channels 26 or adjacent capacitor fingers 50. Preferably, the first capacitor electrode 46 comprises the greatest part of the first front-side metallization layer 34 and is interrupted, that is to say has a cutout 52, only where an electrical contact is produced between a contact channel 26 and the second front-side metallization layer 38 in the form of a plated-through hole 54.

The capacitor fingers 50 of the second capacitor electrode 48 are arranged in a manner lying opposite the first capacitor electrode 46 at least partly, preferably completely with respect to the capacitor dielectric 36, that is to say arranged in a manner adjoining the capacitor dielectric 36. This results in a particularly high electrical capacitance between the first capacitor electrode 34 and the second capacitor electrode 48. In this case, the two capacitor electrodes are preferably designed to be connected to the two poles of a supply voltage or of an electrical supply system for an electronic circuit and transmit said supply voltage to the electronic circuit. In this case, the electrical capacitance occurring in the carrier 10 between the first 46 and the second capacitor electrode 48 brings about an attenuation or suppression of, in particular, high-frequency voltage fluctuations in the supply system. The integrated capacitance of the carrier thus brings about interference suppression of the supply system or the supply voltage. For this purpose, one of the two capacitor electrodes is connected to the potential of the supply voltage (VDD), while the other capacitor electrode is grounded (GND). Consequently, the first capacitor electrode and/or the second capacitor electrode preferably forms a first and/or second supply electrode, respectively, for electrically connecting the microelectronic devices and/or circuits to a first and/or second pole, respectively, of the supply voltage.

The second front-side metallization layer 38 and also those regions of the first front-side 38 and the first rear-side metallization layer 42 which are not utilized for the capacitor electrodes 46 and 48 are utilized for the transmission of further electrical signals (e.g. RF signals). In particular, the contact channels 26 are at least partly electrically conductively connected both to regions of the front-side metallization layers and, in particular, of the second front-side metallization layer 38 and regions of the first rear-side metallization layer 42 with formation of plated-through holes 54, in order that rear-side contacts 56 are electrically conductively connected to front-side contacts 58. FIG. 1 shows a rear-side contact 56 which is configured, in particular, as a standard flip-chip interconnect and is electrically conductively connected to a front-side contact 58 configured as a face-to-face interconnect. The carrier 10 makes contact with an electronic chip 60 via the front-side contact 58. Corresponding front-side contacts are provided for all signals and voltages required in the chip 60.

The second front-side metallization layer or level 38 preferably carries signal lines or interconnects 44. The first front-side metallization layer or level 34 is provided as metallization as far as possible over the whole area for the supply voltage. The metal level on the rear side of the carrier 10, the first rear-side metallization layer or level 42 is embodied as ground area. Openings or cutouts 52 for plated-through holes 54 and also necessary regions for the rewiring reduce the area of the supply voltage and ground, that is to say the area of the first capacitor electrode 46 and of the second capacitor electrode 48.

Furthermore, the contact channels 26 not required for the rewiring are electrically conductively connected to the ground area, that is to say that part of the second capacitor electrode 48 which is comprised by the first rear-side metallization layer 42. A coupling capacitance can thus arise between the capacitor fingers 50 of the second capacitor electrode 48 and the first front-side metallization layer 34 and in particular the first capacitor electrode 46. The use of a dielectric (e.g. $TiO_2$) having a relative permittivity of 95 and a typical thickness of 200 nm makes it possible to achieve high capacitance values depending on the diameter of the holes of approximately 800 to 3300 pF/mm$^2$. Given a module size of 100 mm$^2$, for example, 80-330 nF are thus available for radiofrequency interference suppression of the supply system.

An advantage of this embodiment is that the capacitances can be realized without further addition of process steps and thus in a very cost-effective manner. The dielectric (e.g. $TiO_2$) serves as an insulator in order—where necessary—to insulate the various metallic conductors and/or the conductive substrate from one another, and at the same time as a dielectric for producing the integrated capacitance.

TABLE 1 capacitance values that can be achieved for the first embodiment shown in FIG. 1 with different sizes of the plated-through holes

| Diameter of the holes in μm | Capacitance/area ratio in pF/mm$^2$ |
| --- | --- |
| 5 | 800 |
| 10 | 1200 |
| 50 | 3300 |

Table 1 shows calculated values for the capacitance per area for the first embodiment shown in FIG. 1, the distance between the midpoints of the contact channels or holes being twice as large as the diameter of the contact channels or holes that is specified in the table.

In a departure from the embodiment shown, the capacitor fingers 50 could also be formed as part of the first capacitor electrode 46, that is to say be conductively connected to the areal part of the first capacitor electrode 46 in the first front-side metallization layer 34. In this case, the capacitor fingers 50 would no longer be conductively connected to the first rear-side metallization layer 42. In this alternative case, the capacitor dielectric 36 is preferably arranged at the second interface 16, that is to say between the substrate and the first rear-side metallization layer 42.

Figure 2:
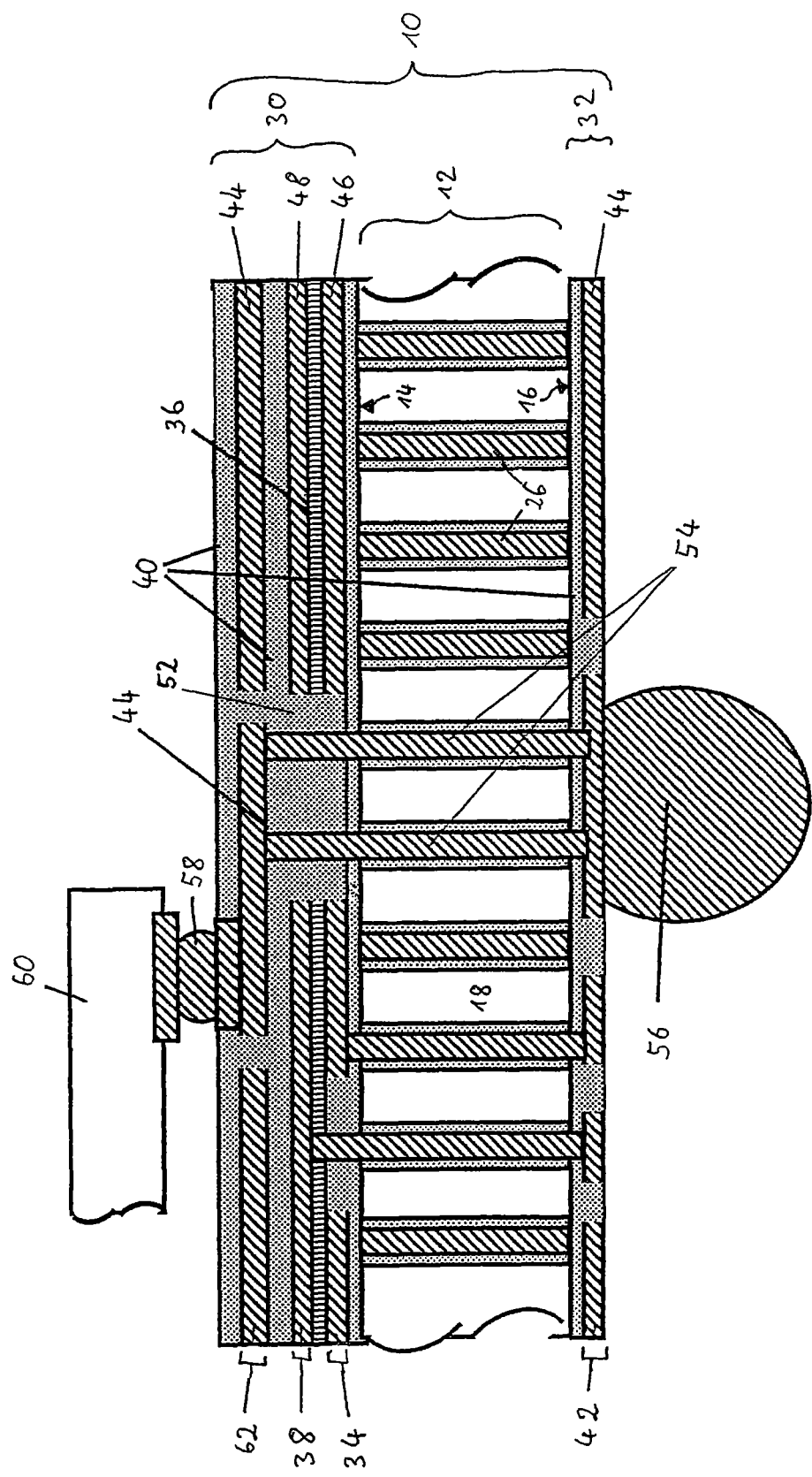
FIG. 2 shows a second preferred embodiment of the present invention.

A second preferred embodiment of the present invention is illustrated in FIG. 2. In a departure from the first embodiment shown, in the second preferred embodiment, the capacitor dielectric 36 is arranged at that side of the first front-side metallization layer 34 which is remote from the first interface 14, and in a manner adjoining said layer. The first front-side metallization layer 34 is spaced apart from the first interface 14 by the front-side wiring insulation 40 arranged in between. The second front-side metallization layer 38 is formed in a manner directly adjoining the capacitor dielectric 36. The capacitor dielectric 36 thus isolates the first 34 from the second front-side metallization layer 38.

While the first capacitor electrode 46 is formed in the first front-side metallization layer 34 analogously to the first embodiment, in a departure from the first embodiment, in the embodiment shown in FIG. 2, the second capacitor electrode 48 is comprised by the second front-side metallization layer 38. Once again both capacitor electrodes are configured at least partly in areal fashion or in large-area fashion. Particularly preferably, the capacitor electrodes comprise all the regions of the first 34 and the second front-side metallization layer 38 which are not required for signal transmission. Particularly with the use of a thin capacitor dielectric 36 having a high relative permittivity, it is thus possible to achieve a large electrical capacitance between the capacitor electrodes, which brings about a particularly efficient interference suppression of the supply system or of signal voltages. For this purpose, the two capacitor electrodes 46 and 48 are again in each case connected to the poles of the supply system or of the supply voltage or the signal voltage.

As shown in FIG. 2, in this embodiment the front-side wiring layer 30 comprises a third front-side metallization layer 62. This layer and in particular the interconnects 44 formed in this layer are utilized just like the first rear-side metallization layer 42 at least partly for the signal transmission, in particular the transmission of RF and radiofrequency signals. Plated-through holes 54 are once again provided which electrically conductively connect the rear-side contact 56 to the front-side contact 58.

With the use of the second front-side metallization layer 38 for the formation of the second capacitor electrode 48, it is possible to implement the coupling capacitance between two metal planes. The capacitance thus increases to 4200 pF/mm². The first rear-side metallization layer 42 thus becomes free and can be utilized for additional rewirings of signals.

Figure 3:
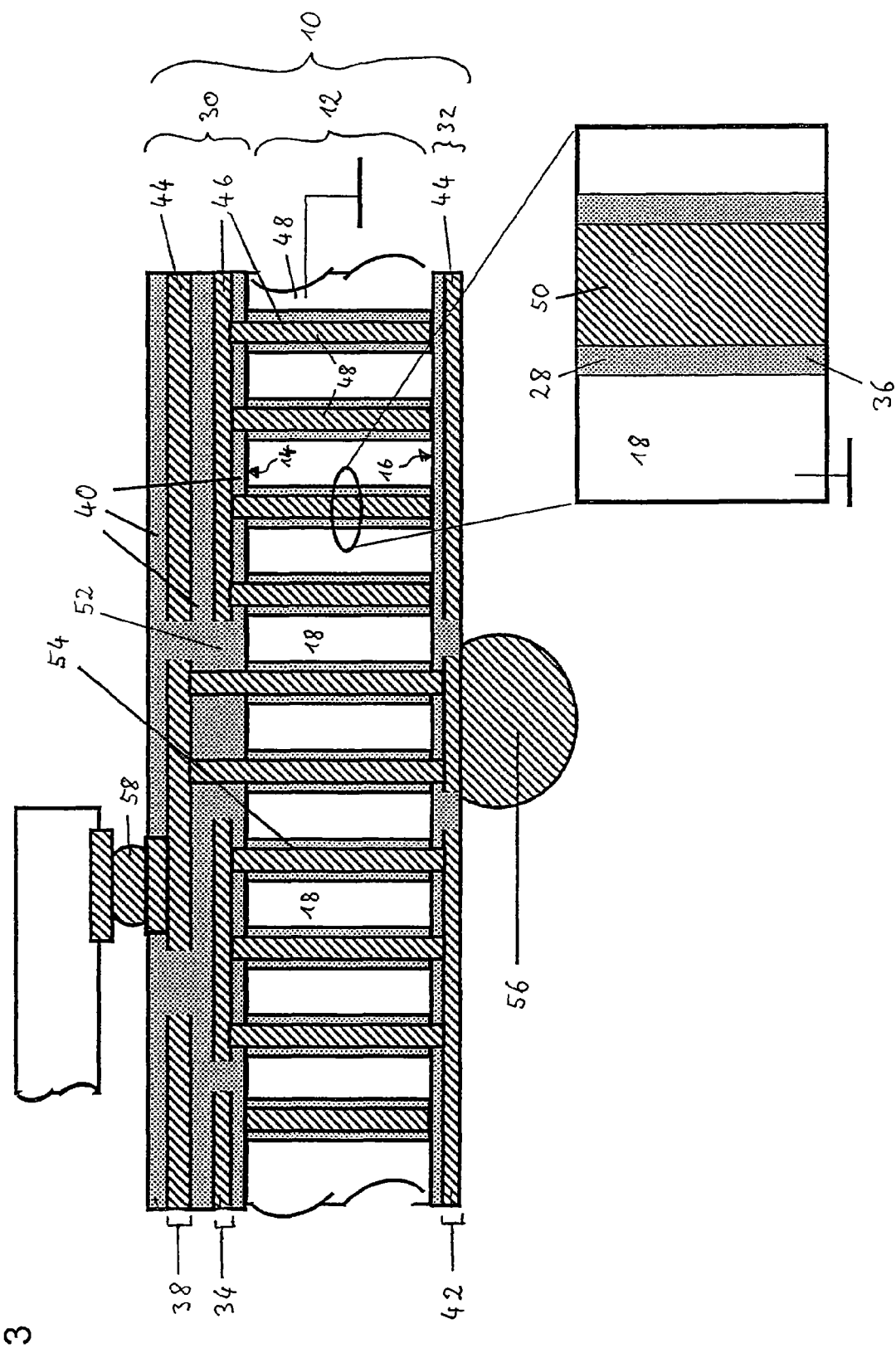
FIG. 3 shows a third preferred embodiment of the present invention.

In a third preferred embodiment, as is illustrated in FIG. 3, the substrate body 18 of the substrate 12 is electrically conductively doped and configured as a second capacitor electrode 48. In particular, the doped substrate body 18 is configured for electrical connection to a pole of the supply voltage and in particular to ground (GND).

The first front-side wiring layer 30 comprises the first front-side metallization layer 34 and the second front-side metallization layer 38, which are in each case electrically insulated and spaced apart from one another and from the first interface 14 by the front-side wiring insulation 40 and the capacitor dielectric 36. The first capacitor electrode 46 is partly formed in the first front-side metallization layer 34.

Moreover, the first capacitor electrode 46 comprises a plurality of capacitor fingers 50 which are electrically conductively connected to that part of the first capacitor electrode 46 which is formed in the first front-side metallization layer 34. The plurality of the capacitor fingers 50 of the first capacitor electrode 46 are formed by a portion of the contact channels 26 of the substrate 12. The capacitor fingers 50 of the first capacitor electrode 46 are electrically insulated from the conductive substrate body 18 by the passage insulation 28.

Consequently, the system comprising the first capacitor electrode 46, the electrically conductive substrate body 18 configured as second capacitor electrode 48, and the passage insulation 28 configured as capacitor dielectric forms a capacitor structure. On account of the electrical capacitance thereby produced between the first 46 and the second capacitor electrode 48, interference suppression of the supply voltage is achieved. For this purpose, the first capacitor electrode 46 is designed to be connected to the corresponding other pole of the supply voltage. As in the other embodiments, in order to achieve a largest possible capacitance, a large part of the first front-side metallization layer 34 and of the contact channels 26 is utilized as first capacitor electrode 46. In particular, the capacitance of this capacitor structure is adapted to the required interference suppression property of the carrier 10.

For this embodiment, the substrate body preferably comprises doped silicon material, an electrical resistivity for the substrate body within the range of approximately 100 ohm cm to 1 kohm cm (p- or n-doped) being used, by way of example. Preferably, the substrate body comprises at least locally additional dopings which lower the electrical resistivity at least locally. Consequently, the electrical resistivity of the substrate body preferably at least partly or locally lies below 1 ohm cm, particularly preferably below 10 mohm cm, and most preferably is approximately 1 mohm cm. It is thus possible to achieve a reduction of electrical losses and an increase in the quality factors of the capacitances that arise. The capacitor dielectric 36 preferably comprises $SiO_2$. The use of more highly doped silicon for the substrate body makes it possible to increase the quality factor of the resulting capacitance.

Given a wafer thickness of 150 μm and a 200 nm thick $SiO_2$ dielectric, it is possible to achieve very high capacitances depending on the diameter of the plated-through hole of 1600 to 4100 pF/mm². A distance between the midpoints of the capacitor fingers which corresponds to twice the diameter of the capacitor fingers (holes) was once again chosen for the values specified in table 2. With a typical module size of 100 mm², it is thus possible to obtain a coupling capacitance of 160 to 410 nF. Depending on the application, it is thereby possible to realize very good decoupling concepts for the supply system of a module.

TABLE 2 capacitance values that can be achieved for the embodiment shown in FIG. 3 with different sizes of the plated-through holes.

| Diameter of the holes in μm | Capacitance/area ratio in pF/mm² |
|---|---|
| 5 | 4100 |
| 10 | 2900 |
| 50 | 1600 |

In this design variant, too, no additional process steps are required to produce the integrated capacitances.

Figure 4:
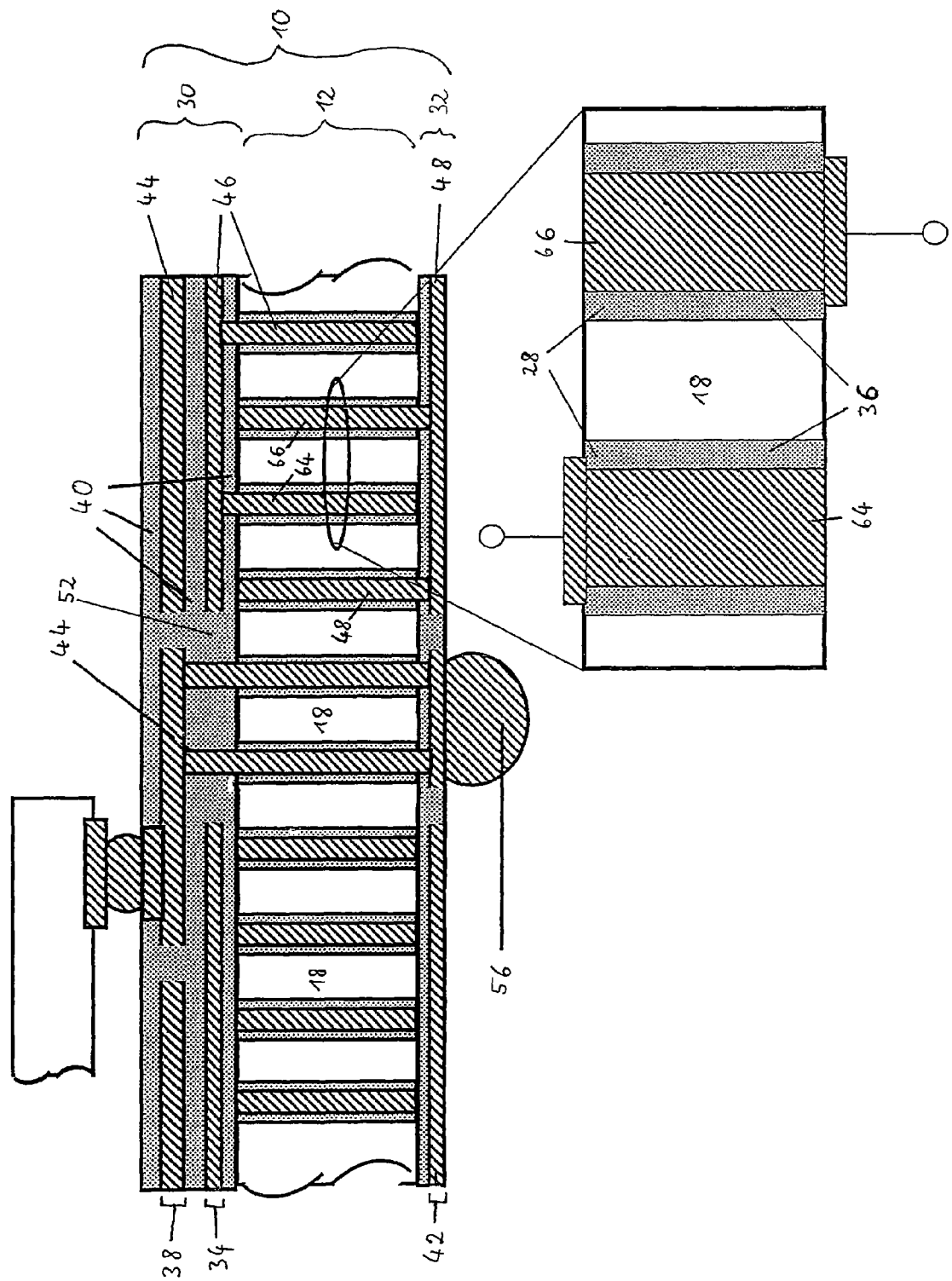
FIG. 4 shows a fourth preferred embodiment of the present invention.

FIG. 4 shows a fourth preferred embodiment of the present invention. The substrate body 18 is once again electrically conductively doped. The first capacitor electrode 46 is partly formed in the first front-side metallization layer 34, while the second capacitor electrode 48 is partly formed in the first rear-side metallization layer 42. The first capacitor electrode 46 additionally comprises a plurality of first capacitor fingers 64 which are formed by a portion of the contact channels 26 and are electrically conductively connected to that part of the first capacitor electrode 46 which is formed in the first front-side metallization layer 34. The second capacitor electrode 48 correspondingly comprises a plurality of second capacitor fingers 66 which are electrically conductively connected to corresponding regions of the first rear-side metallization layer 42. In this case, the capacitor fingers of one capacitor electrode are in each case insulated from the metallization layer of the respective other capacitor electrode by the wiring insulation 40, which forms a part of the capacitor dielectric 36 in regions, and from the electrically conductive substrate body 18 by the passage insulation 28, which likewise forms a part of the capacitor dielectric 36.

In this case, the first 64 and second capacitor fingers 66 are in each case arranged alternately at least in one direction, that is to say that the capacitor fingers adjacent to a first capacitor finger 64 belong to the second capacitor electrode 48, and vice versa. This arrangement can hold true in both two-dimensional spatial directions of the preferably square arrangement of passage channels, that is to say capacitor fingers. As an alternative, the contact channels may also belong in rows to the same capacitor electrode, the association thereof changing from row to row. In any event a high electrical capacitance between the capacitor electrodes is achieved by means of this arrangement of the capacitor electrodes 46 and 48.

As a result of connecting the capacitor electrodes to the poles of the supply voltage, an interference suppression of the supply system is thus effected. In this case, the arrangement of the capacitor electrode which is shown in the fourth embodiment can be understood as a series circuit of two capacitor structures. In this case, the first capacitor structure is formed between the first capacitor electrode 46 and the electrically conductively doped substrate body 18, while the transition between the substrate body 18 and the second capacitor electrode 48 forms the second capacitor structure. By means of this series circuit of the capacitances and in particular also by means of a suitable doping of the substrate body 18, it is possible to improve the quality factor of the capacitance between the capacitor electrodes, which leads to a better controllable interference suppression of the supply system.

In this design variant, the capacitance that can be obtained is reduced in comparison with the third embodiment shown, but the quality factors can be increased. Capacitances of approximately 500 to 1400 pF/mm$^2$ are achieved depending on the diameter of the capacitor fingers.

A capacitor dielectric 36 having a high relative permittivity is particularly preferred. In particular, the relative permittivity of the capacitor dielectric 36 is preferably greater than the dielectric constant of the wiring insulation 40. By way of example, $SiO_2$ could be used for the wiring insulation 40, while $TiO_2$ and/or $Al_2O_3$ and/or $Ta_2O_5$ and/or $HfO_2$ and/or $Si_3N_4$ and/or ONO (in particular the layer structure $SiO_2$/$Si_3N_4$/$SiO_2$) is particularly well suited as the capacitor dielectric 36. In particular in the first, third and fourth embodiments, the passage insulation 28 also preferably has a high relative permittivity. The production of this dielectric layer with a high capacitance may be effected e.g. by means of known methods such as sputtering (physical vapor deposition), CVD (chemical vapor deposition), MOCVD (metal organic CVD) or ALD (atomic layer deposition).

All the embodiments shown are very well suited to radiofrequency interference suppression of the supply networks since large capacitance values per area can be obtained. Primarily the first two embodiments illustrated in FIGS. 1 and 2 are furthermore also particularly well suited to the realization of radiofrequency capacitances in applications for filters and tuning elements, since capacitances having a high quality factor can be obtained. In this case, the first and second capacitor electrodes are configured as first and second signal electrodes for transmitting an electrical signal to the microelectronic circuit or the chip 60.

We claim:

1. A carrier for microelectronic devices and/or circuits comprising:
    a substrate having a first interface with a plurality of first contact holes, a second interface, which essentially lies opposite the first interface, with a plurality of second contact holes, a substrate body, and a plurality of electrically conductive contact channels formed in the substrate body, wherein each of the contact channels electrically conductively connects a first contact hole to a second contact hole; and
    at least one front-side wiring layer arranged on the first interface and having formed therein at least one first front-side metallization layer at least partly comprising a first capacitor electrode configured to electrically connect the microelectronic devices and/or circuits to a first pole of a signal or supply voltage; and
    a rear-side wiring layer arranged at the second interface and having formed therein at least one first rear-side metallization layer which at least partly comprises a second capacitor electrode,
    wherein the first capacitor electrode and/or the second capacitor electrode comprises a plurality of first and/or second capacitor fingers, respectively, formed by a plurality of the contact channels which are electrically conductively connected to the first front-side metallization layer and/or the first rear-side metallization layer, respectively,
    wherein the first front-side metallization layer and/or the first rear-side metallization layer are/is spaced apart from the first and/or second interface, respectively, at least in regions by a capacitor dielectric, and
    wherein the first capacitor electrode, at least partly via the capacitor dielectric formed in the carrier and/or via electrically conductive regions of the substrate, couples capacitively to the second capacitor electrode which electrically connects the microelectronic devices and/or circuits to a second pole of the signal or supply voltage.

2. The carrier as claimed in claim 1, wherein the first capacitor electrode and/or the second capacitor electrode forms a first and/or second supply electrode, respectively, for electrically connecting the microelectronic devices and/or circuits to a first and/or second pole, respectively, of a supply voltage.

3. The carrier as claimed in claim 1, wherein in the first front-side metallization layer and/or the first rear-side metallization layer there is formed at least one front-side and/or rear-side interconnect, respectively, which is electrically conductively connected to at least one contact channel.

4. The carrier as claimed in claim 3, wherein the first capacitor electrode comprises essentially the entire area not used for interconnects and/or plated-through holes in the first front-side metallization layer.

5. The carrier as claimed in claim 1, wherein the substrate body at least partly comprises electrically conductively doped silicon.

6. The carrier as claimed claim 1, wherein the capacitor dielectric comprises an insulator having a high dielectric constant.

7. The carrier as claimed claim 6, wherein the insulator is at least one of $TiO_2$, $Al_2O_3$, $Ta_2O_5$, $HfO_2$, $Si_3N_4$, an ONO layer structure, and a $SiO_2/Si_3N_4/SiO_2$ layer structure.

8. The carrier as claimed in claim 1, wherein the electrical capacitance formed per area in the carrier between the first capacitor electrode and the second capacitor electrode is at least partly greater than 500 $pF/mm^2$.

9. The carrier as claimed in claim 1, wherein the electrical capacitance formed per area in the carrier between the first capacitor electrode and the second capacitor electrode is at least partly greater than 1 $nF/mm^2$.

10. The carrier as claimed in claim 1, wherein the electrical capacitance formed per area in the carrier between the first capacitor electrode and the second capacitor electrode is at least partly greater than 3 $nF/mm^2$.

11. The carrier as claimed in claim 1, wherein the electrical capacitance formed in the carrier between the first capacitor electrode and the second capacitor electrode is greater than 50 nF.

12. The carrier as claimed in claim 1, wherein the electrical capacitance formed in the carrier between the first capacitor electrode and the second capacitor electrode is greater than 100 nF.

13. The carrier as claimed in claim 1, wherein the electrical capacitance formed in the carrier between the first capacitor electrode and the second capacitor electrode is greater than 300 nF.

14. The carrier as claimed in claim 1, wherein the plurality of first capacitor fingers are spaced apart from and electrically insulated from the substrate body by the capacitor dielectric.

15. The carrier as claimed in claim 1, wherein the plurality of second capacitor fingers are spaced apart from and electrically insulated from the substrate body by the capacitor dielectric.

16. The carrier as claimed in claim 1, wherein the capacitive coupling between the first and the second capacitor electrode is effected via the substrate body.

17. The carrier as claimed in claim 1, wherein the second capacitor electrode at least partly comprises the substrate body.

18. The carrier as claimed in claim 1, wherein the second capacitor electrode is at least partly comprised by a second front-side metallization layer which is formed in the front-side wiring layer and which is at least partly spaced apart from the first front-side metallization layer by the capacitor dielectric.

19. The carrier as claimed in claim 1, wherein inductances are formed in at least one of the metallization layers.

20. The carrier as claimed in claim 1, wherein the at least one front-side wiring layer further comprises a third front-side metallization layer.

* * * * *